US012322630B2

(12) United States Patent
Lin et al.

(10) Patent No.: US 12,322,630 B2
(45) Date of Patent: Jun. 3, 2025

(54) APPARATUS FOR TRANSFERRING ELECTRONIC COMPONENT FROM FLEXIBLE CARRIER SUBSTRATE TO FLEXIBLE TARGET SUBSTRATE AND METHOD OF TRANSFERRING ELECTRONIC COMPONENT

(71) Applicant: Micraft System Plus Co., Ltd., Taoyuan (TW)

(72) Inventors: Chingju Lin, Taoyuan (TW); Yi Xian Wu, Taoyuan (TW)

(73) Assignee: Micraft System Plus Co., Ltd., Taoyuan (TW)

(*) Notice: Subject to any disclaimer, the term of this patent is extended or adjusted under 35 U.S.C. 154(b) by 500 days.

(21) Appl. No.: 17/884,575

(22) Filed: Aug. 10, 2022

(65) Prior Publication Data

US 2023/0142207 A1 May 11, 2023

Related U.S. Application Data

(60) Provisional application No. 63/275,953, filed on Nov. 5, 2021.

(30) Foreign Application Priority Data

Jan. 10, 2022 (TW) .................. 111100995

(51) Int. Cl.
*H01L 21/677* (2006.01)
*H01L 21/683* (2006.01)
*H01L 21/687* (2006.01)
(52) U.S. Cl.
CPC .... *H01L 21/67766* (2013.01); *H01L 21/6838* (2013.01); *H01L 21/687* (2013.01)

(58) Field of Classification Search
CPC ....... H01L 21/0277; H01L 2221/68363; H01L 21/67132; H10D 30/015
See application file for complete search history.

(56) References Cited

U.S. PATENT DOCUMENTS 10,490,532 B2  11/2019 Huska et al.
10,615,153 B2   4/2020 Huska et al.
(Continued)

FOREIGN PATENT DOCUMENTS

CN    107452648    12/2017
TW    201916210     4/2019
(Continued)

OTHER PUBLICATIONS

"Notice of allowance of Taiwan Counterpart Application", issued on Feb. 22, 2023, p. 1-p. 7.

*Primary Examiner* — Evren Seven
(74) *Attorney, Agent, or Firm* — JCIPRNET

(57) ABSTRACT

An apparatus for transferring an electronic component from a flexible carrier substrate to a flexible target substrate is provided. The apparatus includes a first frame, a second frame, an abutment element and a deformation generating mechanism. The first frame is used to carry the flexible carrier substrate. The second frame is used to carry the flexible target substrate. The abutment element is arranged adjacent to the first frame, and is controlled by a braking mechanism, and move repeatedly toward and away from the second frame. The deformation generating mechanism is adjacent to the second frame and arranged opposite to the abutment element. When the abutment element moves toward the second frame, the deformation generating mechanism forms a relative force toward the abutment element at a position where the surface of the flexible target substrate carried by the second frame is relative to the abutment element.

6 Claims, 13 Drawing Sheets

(56) References Cited

U.S. PATENT DOCUMENTS

| | | | |
|---|---|---|---|
| 2008/0124842 A1* | 5/2008 | Wang | G06K 19/07752 |
| | | | 438/118 |
| 2020/0105551 A1* | 4/2020 | Wendt | H01L 21/67144 |
| 2020/0251453 A1* | 8/2020 | Huska | H01L 21/67265 |
| 2020/0294839 A1 | 9/2020 | Lee et al. | |
| 2023/0026488 A1* | 1/2023 | Lai | H01L 21/6835 |
| 2023/0030227 A1* | 2/2023 | Chuan | H01L 25/167 |
| 2023/0356520 A1* | 11/2023 | Ramaswamy | B32B 43/006 |
| 2023/0377917 A1* | 11/2023 | Kupcow | H01L 21/67144 |

FOREIGN PATENT DOCUMENTS

| | | |
|---|---|---|
| TW | 202133294 | 9/2021 |
| WO | 9942289 | 8/1999 |

\* cited by examiner

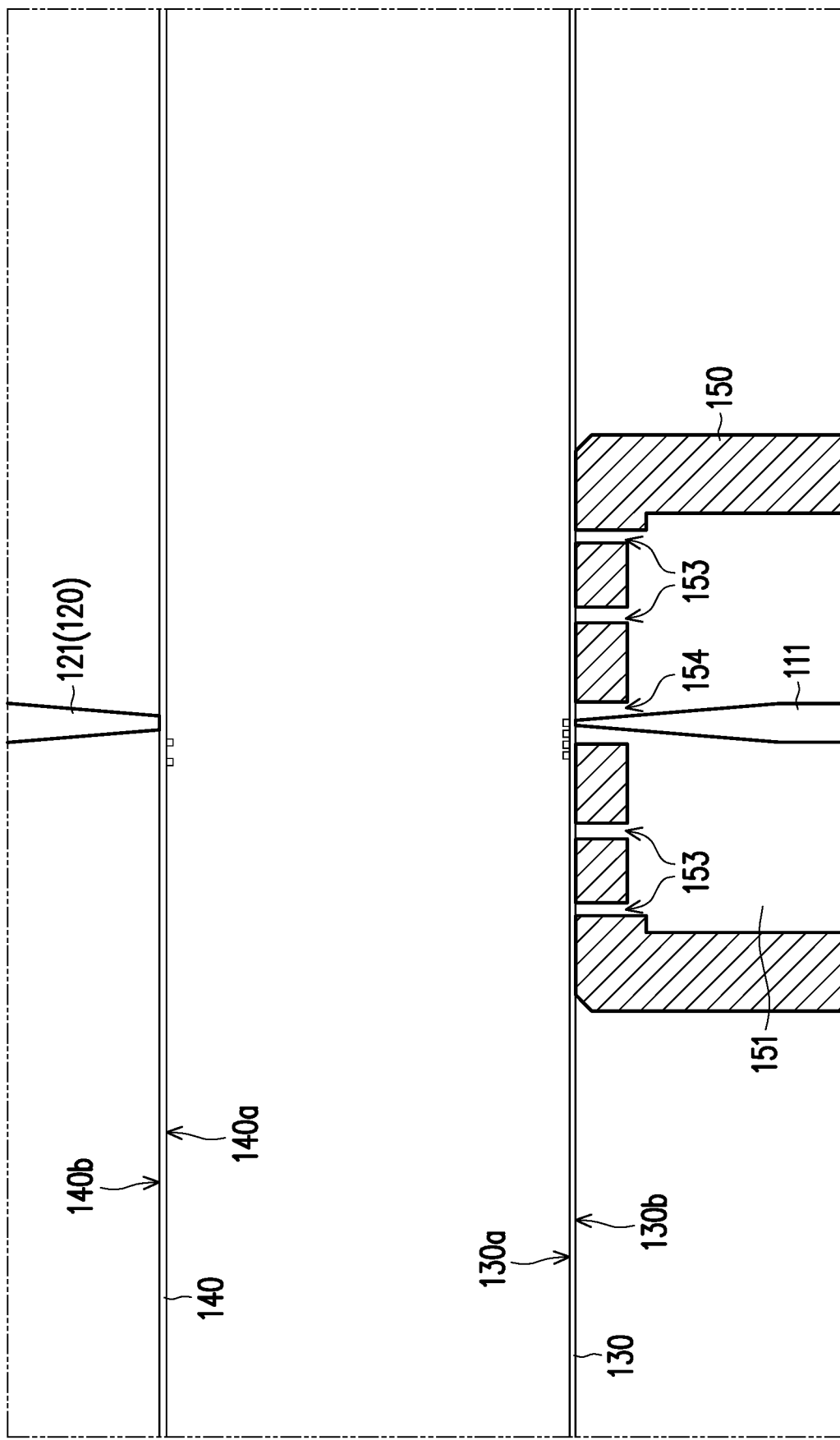

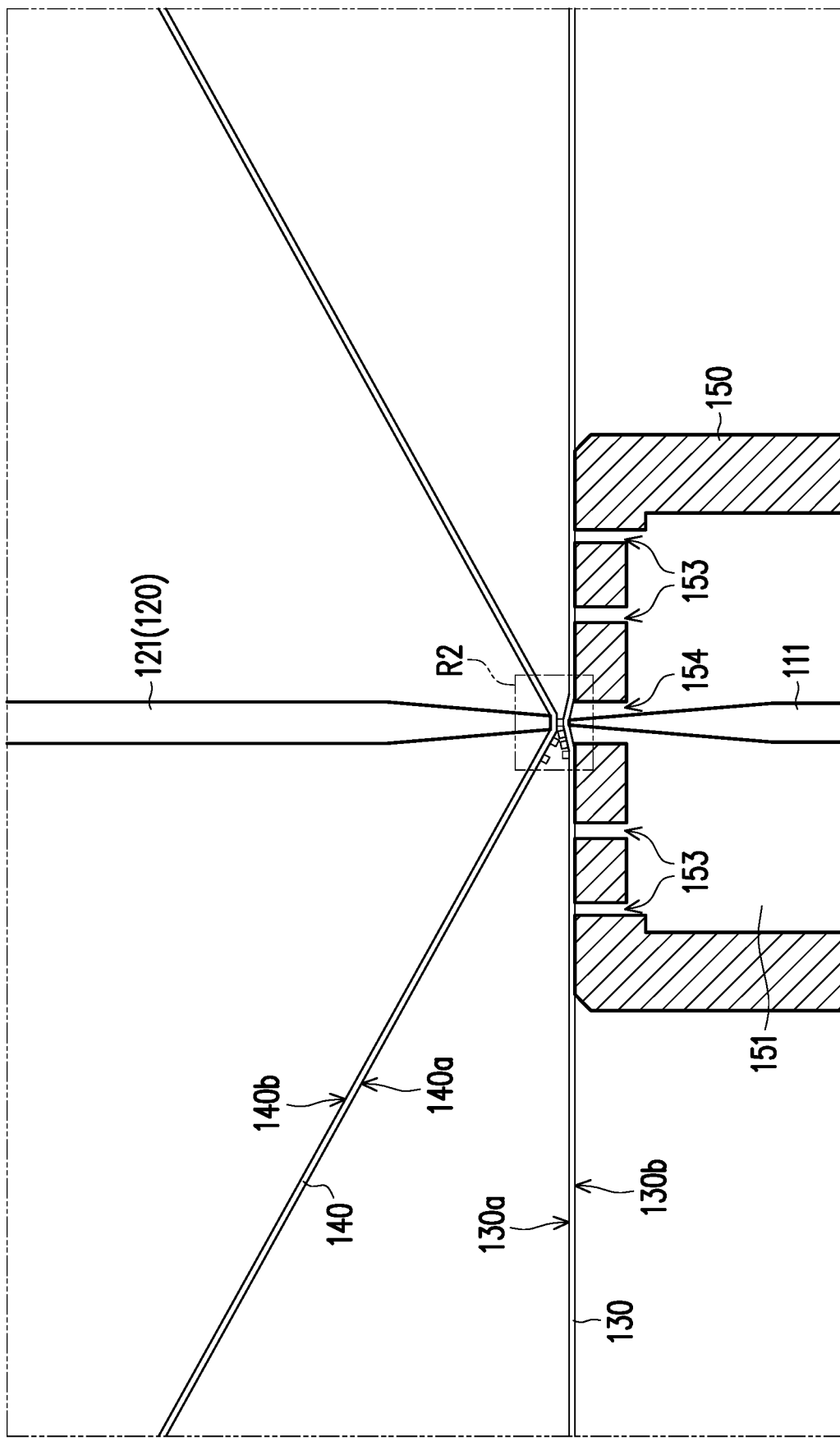

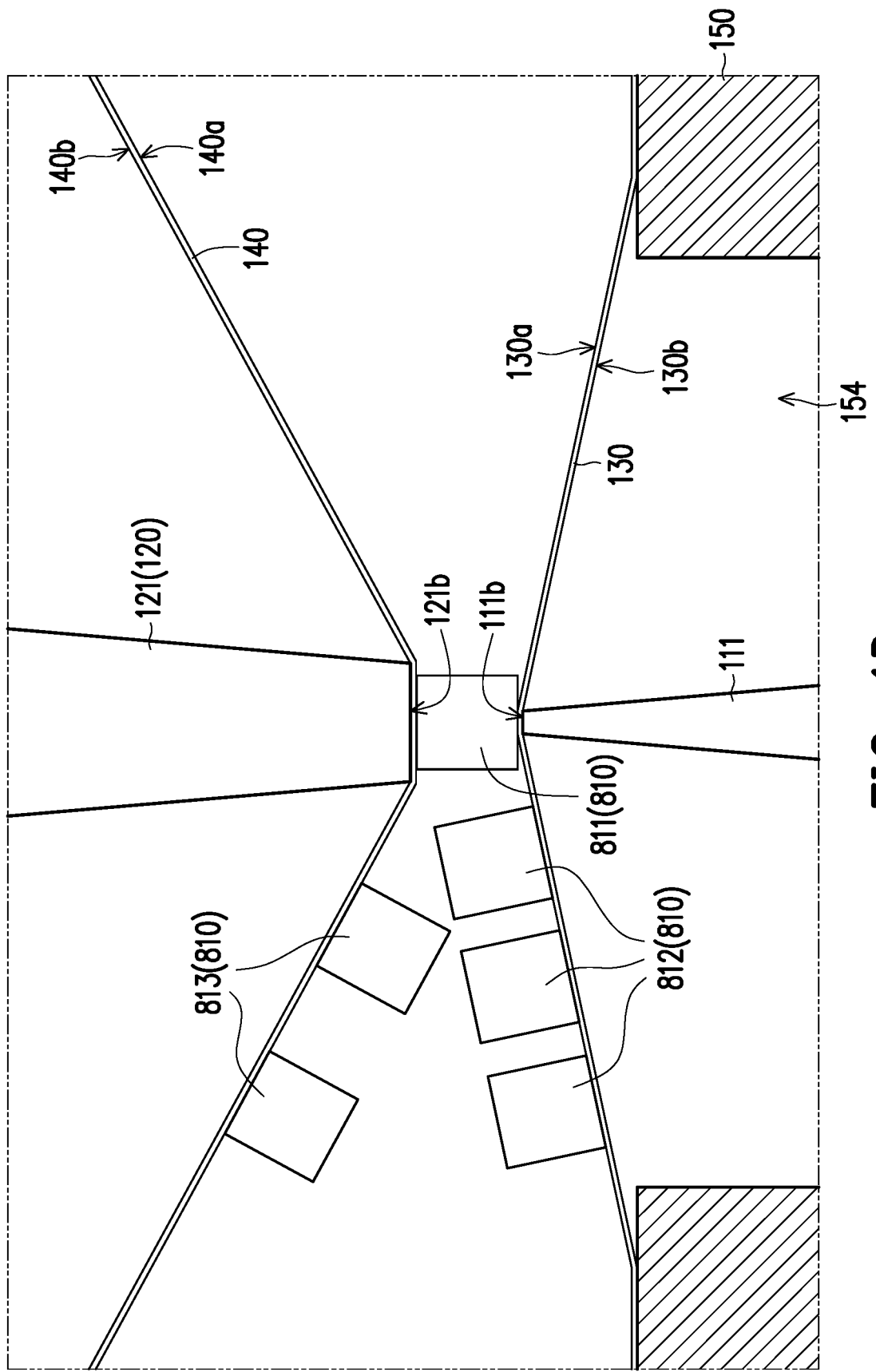

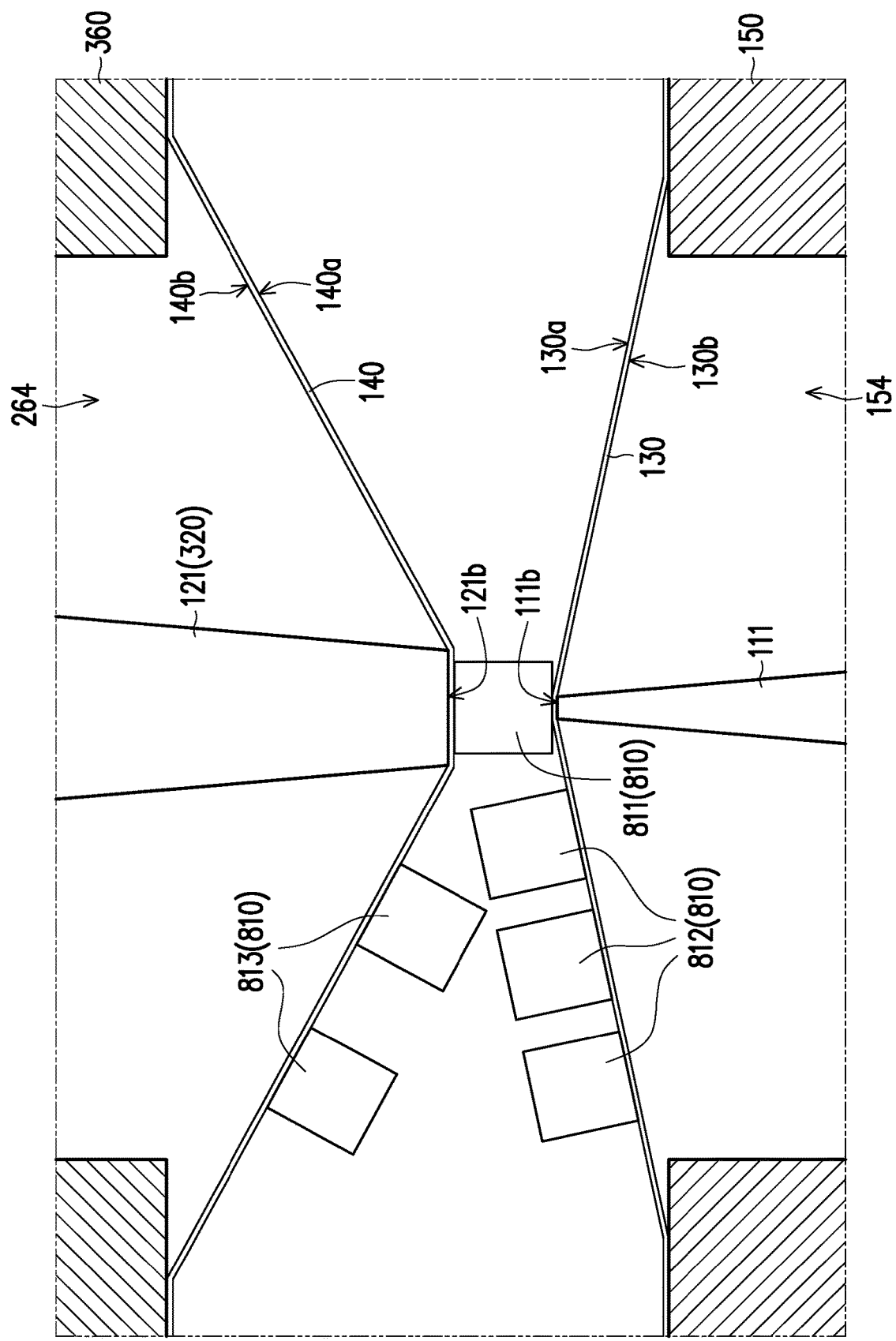

APPARATUS FOR TRANSFERRING ELECTRONIC COMPONENT FROM FLEXIBLE CARRIER SUBSTRATE TO FLEXIBLE TARGET SUBSTRATE AND METHOD OF TRANSFERRING ELECTRONIC COMPONENT

CROSS-REFERENCE TO RELATED APPLICATION

This application claims the priority benefit of U.S. provisional application Ser. No. 63/275,953, filed on Nov. 5, 2021 and Taiwan application serial no. 111100995, filed on Jan. 10, 2022. The entirety of each of the above-mentioned patent applications is hereby incorporated by reference herein and made a part of this specification.

BACKGROUND

Technical Field

The invention relates to an apparatus for transferring an electronic component from a flexible carrier substrate to a flexible target substrate and a method of transferring an electronic component.

Description of Related Art

In manufacturing electronic products, steps for transferring related electronic components are often required. For example, in manufacturing light-emitting diode (LED) displays, the light-emitting diodes are often transferred from a flexible substrate to another flexible substrate by a pick-and-place apparatus. However, a throughput or yield of the approach may be low.

SUMMARY

The invention is directed to an apparatus for transferring an electronic component from a flexible carrier substrate to a flexible target substrate and a method of transferring an electronic component, which are adapted to transfer the electronic component.

The invention provides an apparatus for transferring an electronic component from a flexible carrier substrate to a flexible target substrate. The apparatus includes a first frame, a second frame, an abutment element and a deformation generating mechanism. The first frame is configured to carry the flexible carrier substrate. The second frame is configured to carry the flexible target substrate. The abutment element is arranged adjacent to the first frame, controlled by a braking mechanism, and adapted to move repeatedly toward and away from the second frame. The deformation generating mechanism is adjacent to the second frame and arranged opposite to the abutment element. When the abutment element moves toward the second frame, the deformation generating mechanism forms a relative force toward the abutment element at a position where the surface of the flexible target substrate carried by the second frame is relative to the abutment element.

The invention provides a method of transferring an electronic component including following steps: providing a flexible carrier substrate, where the electronic component is carried on the flexible carrier substrate; providing a flexible target substrate; configuring the flexible carrier substrate and the flexible target substrate opposite to each other so that a surface of the flexible carrier substrate carrying the electronic component faces the flexible target substrate; applying an action force on a surface of the flexible carrier substrate that does not carry the electronic component so that the electronic component moves toward the flexible target substrate; applying a relative force on the flexible target substrate so that the flexible target substrate generates a deformation, defining a receiving point on the flexible target substrate by the deformation, and keeping a peripheral region of the receiving point on the flexible target substrate away from the electronic component; contacting and transferring the electronic component to the receiving point; and ceasing applying the action force and the relative force so that the flexible carrier substrate and the flexible target substrate return to their original shapes.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1B to FIG. 1D are schematic partial side views of partial operation method of the apparatus for transferring the electronic component from the flexible carrier substrate to the flexible target substrate according to the first embodiment of the invention.

FIG. 3B to FIG. 3D are schematic partial side views of partial operation method of the apparatus for transferring the electronic component from the flexible carrier substrate to the flexible target substrate according to the third embodiment of the invention.

DESCRIPTION OF THE EMBODIMENTS

Figure 1A:
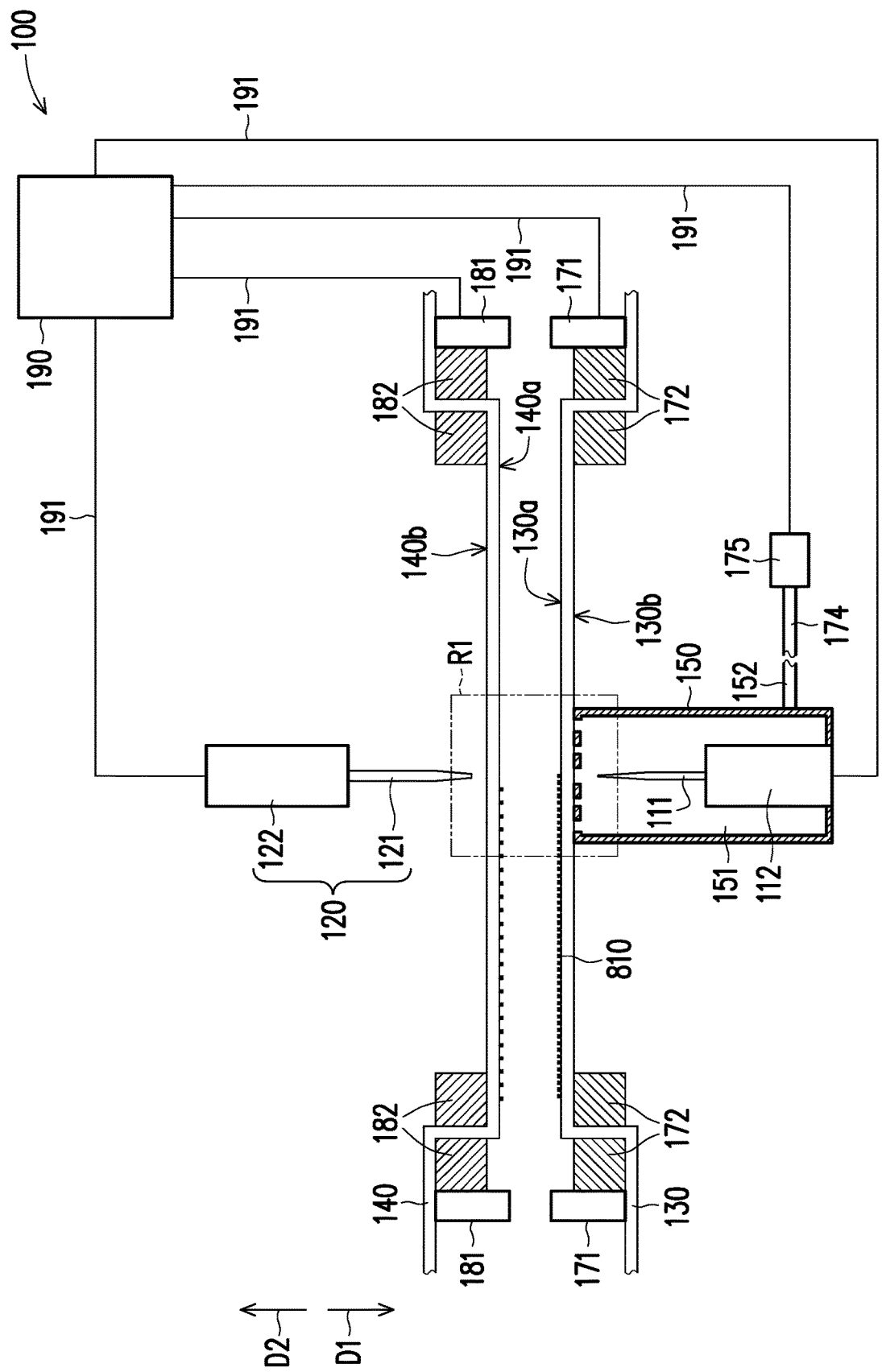
FIG. 1A is a schematic partial side view of an apparatus for transferring an electronic component from a flexible carrier substrate to a flexible target substrate according to a first embodiment of the invention.

The content of the following examples is for illustration rather than limitation. Moreover, descriptions of well-known devices, methods and materials may be omitted so as not to obscure descriptions of various principles of the invention. Directional terms (for example, up, down, top, bottom) as used herein refer only to the drawings or corresponding idioms, and are not intended to imply absolute orientations. In addition, unless the content clearly dictates otherwise, the singular forms "a," "an," "the," or forms that do not specifically refer to a quantity may include one or plural forms, i.e., include "at least one."

In some of the drawings, some components or layers may be enlarged, reduced or omitted for clarity's sake. For example, in FIG. 1A, FIG. 2A or FIG. 3A, electronic components 810 may be enlarged and/or a thickness of a flexible carrier substrate 130 or a thickness of a flexible target substrate 140 may be enlarged.

Similar components are denoted by the same reference numerals, and have similar functions, materials or forms, and descriptions thereof are omitted. It will be apparent to those of ordinary skill in the art to which the invention pertains, from the content of the embodiments and the corresponding illustrations, that the invention may be practiced in other embodiments that depart from the specific details disclosed herein.

Referring to FIG. 1A, an electronic component transfer apparatus (which may simply be referred to as an apparatus) 100 may be adapted to transfer the electronic components 810 from a flexible carrier substrate 130 to a flexible target substrate 140 (which will be described in detail later). The electronic component transfer apparatus 100 includes a first frame 171, a second frame 181, an abutment element 111 and a deformation generating mechanism 120. The first frame 171 is configured to carry the flexible carrier substrate 130. The second frame 181 is configured to carry the flexible target substrate 140. The first frame 171 or the second frame 181 may allow the flexible target substrate 140 and the flexible carrier substrate 130 to be disposed opposite to each other. The abutment element 111 is arranged adjacent to the first frame 171. The abutment element 111 is controlled by a braking mechanism 112, and may reciprocate in a direction toward the second frame 181 (which is referred to as a second direction D2) and a direction away from the second frame 181 (which is referred to as a first direction DD. The deformation generating mechanism 120 is adjacent to the second frame 181. The deformation generating mechanism 120 is arranged opposite to the abutment element 111. When the abutment element 111 moves toward the second frame 181, the deformation generating mechanism 120 forms a relative force toward the abutment element 111 on a surface of the flexible target substrate 140 carried by the second frame 181 at a position relative to the abutment element 111. Detailed structures of the abutment element 111 and/or the deformation generating mechanism 120 and/or the corresponding operation method there between are described in detail below.

In the embodiment, the electronic component transfer apparatus 100 may further include a control system 190. The control system 190 may be connected to corresponding components, elements or units (for example, the first frame 171, the second frame 181, the braking mechanism 112, the braking mechanism 122 and/or other devices described later, but the invention is not limited thereto) in signal connection by means of wired signal transmission, but the invention is not limited thereto. In an embodiment, the control system 190 may be connected to the corresponding components, elements or units in signal connection by means of wireless signal transmission. Namely, the electronic component transfer apparatus 100 including the control system 190 and the first frame 171, the second frame 181, the braking mechanism 112, the braking mechanism 122 and/or other devices described later that are connected to the control system 190 in signal connection is the same equipment or machine. In addition, the signal connection mentioned in the invention may generally refer to the connection method of wired signal transmission or wireless signal transmission. Moreover, the invention does not limit all signal connection methods to be the same or different.

In an embodiment, the first frame 171 may indirectly fix the flexible carrier substrate 130 through a carrier frame 172, but the invention is not limited thereto.

In the embodiment, the flexible carrier substrate 130 may include an ultraviolet tape (UV tape) or a blue tape (blue tape), but the invention is not limited thereto. In an embodiment, the carrier frame 172 may be referred to as a blue film frame, but the invention is not limited thereto.

In an embodiment, the flexible carrier substrate 130 may be made of a composite material. For example, the flexible carrier substrate 130 may have a polymer film covered with an adhesive layer.

In the embodiment, the flexible carrier substrate 130 may have a first carrier surface 130a and a second carrier surface 130b opposite to the first carrier surface 130a. The electronic components 810 may be located on the first carrier surface 130a of the flexible carrier substrate 130. The first carrier surface 130a of the flexible carrier substrate 130 may be disposed opposite to a first target surface 140a of the flexible target substrate 140.

In the embodiment, the electronic components 810 may include light-emitting dies (for example, light-emitting diode (LED) chips; but the invention is not limited thereto) or an integrated circuit (IC), but the invention is not limited thereto. In addition, for the sake of clarity, not all of the electronic components 810 are shown or marked one by one in FIG. 1A or other subsequent drawings.

In an embodiment, the second frame 181 may indirectly fix the flexible target substrate 140 through a carrier frame 182, but the invention is not limited thereto.

In an embodiment, a material of the flexible target substrate 140 may be the same or similar to that of the flexible carrier substrate 130, and details thereof are not repeated herein.

A method that the electronic component transfer apparatus 100 transfers the electronic components 810 from the flexible carrier substrate 130 to the flexible target substrate 140 may be as described below. However, it should be noted that the invention is not limited to the methods described below. In addition, for the sake of clarity, in some of the subsequent drawings (for example, FIG. 1B to FIG. 1C), only side cross-sectional views of some components corresponding to a region R1 in FIG. 1A are schematically shown. In addition, for the sake of clarity, some elements or components may be omitted in some of the subsequent drawings.

Referring to FIG. 1A, the electronic component transfer apparatus 100, the flexible carrier substrate 130 carrying the electronic components 810, and the flexible target substrate 140 are provided. The flexible carrier substrate 130 and the flexible target substrate 140 are arranged opposite to each other, and a surface of the flexible carrier substrate 130 carrying the electronic components 810 faces the flexible target substrate 140. Then, the following steps are performed in an unlimited order: applying an action force to a surface of the flexible carrier substrate 130 that does not carry the electronic components 810 to move the electronic components 810 toward the flexible target substrate 140; and applying a relative force to the flexible target substrate 140, such that the flexible target substrate 140 has a deformation, and a receiving point is defined on the flexible target substrate 140 by the deformation, and the flexible target substrate 140 is kept away from the electronic components 810 in a peripheral region of the receiving point. In this way, the electronic components 810 may be contacted and transferred to the receiving point. Then, applying of the action force and the relative force is stopped in an unlimited order to restore the flexible carrier substrate 130 and the flexible target substrate 140 to their original state.

It should be noted that, in FIG. 1A, the number and/or the configuration of the electronic components 810 disposed on the flexible carrier substrate 130 are only illustrative and are not limited by the invention.

It should be noted that in FIG. 1A, the manner of configuring the flexible carrier substrate 130 on the first frame 171 and/or the manner of configuring the flexible target substrate 140 on the second frame 181 are only exemplary, and are not limited by the invention.

Referring to FIG. 1A and FIG. 1B, the abutment element 111 of the electronic component transfer apparatus 100 is brought close to the flexible carrier substrate 130, so that a carrier abutment surface 111b (indicated in FIG. 1D or FIG. 1E) of the abutment element 111 abuts against a surface of the flexible carrier substrate 130 (for example, the second carrier surface 130b) that does not carry the electronic components 810. For example, the abutment element 111 may be moved along a second direction D2 by the braking mechanism 112, so that the abutment element 111 at least contacts the second carrier surface 130b of the flexible carrier substrate 130.

In the embodiment, the abutment element 111 may comprise a pin bolt.

In the embodiment, the carrier abutment surface 111b of the abutment element 111 may be flat or nearly flat. In this way, when the carrier abutment surface 111b of the abutment element 111 abuts against the flexible carrier substrate 130, a possibility of damaging the flexible carrier substrate 130 may be reduced. Namely, the abutment element 111 (for example, the pin bolt) substantially does not penetrate the flexible carrier substrate 130.

Referring to FIG. 1A to FIG. 1B continuously, at least a part of the deformation generating mechanism 120 of the electronic component transfer apparatus 100 is brought close to the flexible target substrate 140. The deformation generating mechanism 120 may include a pin bolt 121 and a corresponding braking mechanism 122. The pin bolt 121 may be moved along a first direction D1 by the braking mechanism 122 to at least make a target abutment surface 121b (indicated in FIG. 1D or FIG. 1E) of the pin bolt 121 abutting against a second target surface 140b of the flexible target substrate 140.

In the embodiment, the target abutment surface 121b of the pin bolt 121 may be flat or nearly flat. In this way, when the target abutment surface 121b of the pin bolt 121 is made to abut against the flexible target substrate 140, the possibility of damaging the flexible target substrate 140 may be reduced. Namely, the pin bolt 121 of the deformation generating mechanism 120 substantially does not penetrate the flexible target substrate 140.

It should be noted that the invention does not limit the order in which the pin bolt 121 of the deformation generating mechanism 120 contacts the flexible target substrate 140 and the abutment element 111 contacts the flexible carrier substrate 130. For example, the pin bolt 121 and the abutment element 111 may contact the flexible target substrate 140 and the flexible carrier substrate 130 at the same time or respectively at different time.

Referring to FIG. 1B to FIG. 1C or 1D, an action force is applied on a surface of the flexible carrier substrate 130 that does not carry the electronic components 810, so that a corresponding electronic component 811 on the flexible carrier substrate 130 (for example, one of the electronic components 810; indicated in FIG. 1D) move toward the flexible target substrate 140.

For example, the abutment element 111 may be moved by the braking mechanism 112, so that the abutment element 111 in contact with the flexible carrier substrate 130 exerts a corresponding action force to the flexible carrier substrate 130, so that the flexible carrier substrate 130 generates a corresponding deflection in the direction of the flexible target substrate 140, and the corresponding electronic component 811 on the flexible carrier substrate 130 may move toward the flexible target substrate 140. Namely, the action force applied to the flexible carrier substrate 130 may be generated by making the abutment element 111 to abut against the flexible carrier substrate 130.

Referring to FIG. 1B to FIG. 1C or FIG. 1D continuously, a relative force is applied on the flexible target substrate 140 to deform the flexible target substrate 140. In addition, a receiving point may be defined on the deformed flexible target substrate 140 (for example, a place of the flexible target substrate 140 corresponding to the target abutment surface 121b of the pin bolt 121 of the deformation generating mechanism 120), where a peripheral region of the receiving point on the flexible target substrate 140 is away from the electronic component 811. Namely, in the deformed flexible target substrate 140, compared to the other regions different from the receiving point (i.e. the peripheral region), the receiving point is closer to the electronic component 811 to be transferred.

For example, the pin bolt 121 may be moved by the braking mechanism 122, and the pin bolt 121 in contact with the flexible target substrate 140 exerts the corresponding relative force on the flexible target substrate 140, so that the flexible target substrate 140 is moved toward the flexible carrier substrate 130 to produces a corresponding deflection. Namely, the relative force applied to the flexible target substrate 140 may be generated by making the pin bolt 121 of the deformation generating mechanism 120 abutting against the flexible target substrate 140.

It should be noted that the invention does not limit the order that the action force is applied to the flexible carrier substrate 130 to produce deformation and the relative force is applied to the flexible target substrate 140 to produce deformation.

Referring to FIG. 1C or 1D, after the action force is applied to the flexible carrier substrate 130 to produce a deformation and the relative force is applied the flexible target substrate 140 to produce a deformation, the electronic component 811 on the flexible carrier substrate 130 may contact the receiving point of the flexible target substrate 140 to be further transferred onto the receiving point of the flexible target substrate 140.

In the embodiment, the electronic component transfer apparatus 100 may further include a casing 150. The casing 150 may have a gas chamber 151, a gas channel 152 and at least one gas opening 153. The gas channel 152 and the gas opening 153 communicate with the gas chamber 151. A location of the gas opening 153 corresponds to the flexible carrier substrate 130. When the abutment element 111 exerts a corresponding action force on the flexible carrier substrate 130, a negative pressure generating device 175 may exhaust air through a gas pipeline 174 connected to the gas channel 152, thereby reducing a scope of deformation generated by the flexible carrier substrate 130.

Taking FIG. 1C and FIG. 1D as an example, the casing 150 may further have an abutment opening 154 communicating with the air chamber 151. The abutment element 111 arranged in the casing 150 may abut against the flexible carrier substrate 130 through the abutment opening 154. When the abutment element 111 exerts the corresponding action force on the flexible carrier substrate 130, the negative pressure generating device 175 may exhaust air. In this way, a part of region of the flexible carrier substrate 130 corresponding to the abutment opening 154 may generate corresponding deformation due to the abutting of the abutment element 111, so that the corresponding electronic component 811 may move toward the flexible target substrate 140. In addition, an air pressure difference generated by the aforementioned air exhaustion (for example, an air pressure outside the casing 150 is greater than an air pressure in the air chamber 151 of the casing 150) may make the other regions of the flexible carrier substrate 130 corresponding to the gas openings 153 to be substantially not deformed. Therefore, transfer precision of the electronic component 811 may be improved.

In an embodiment, when the electronic component 811 on the flexible carrier substrate 130 contact the receiving point of the flexible target substrate 140, the air pressure in the air chamber 151 of the casing 150 is started to decrease.

In an embodiment, before the electronic component 811 on the flexible carrier substrate 130 contacts the receiving point of the flexible target substrate 140, the air pressure in the air chamber 151 of the casing 150 is started to decrease.

In an embodiment, before starting to decrease the air pressure in the air chamber 151 of the casing 150, the second carrier surface 130b of the flexible carrier substrate 130 may touch an outer surface of the casing 150, but the invention is not limited thereto. In an embodiment that is not shown, before starting to decrease the air pressure in the air chamber 151 of the casing 150, a gap may exist between the second carrier surface 130b of the flexible carrier substrate 130 and the outer surface of the casing 150.

Figure 1E:
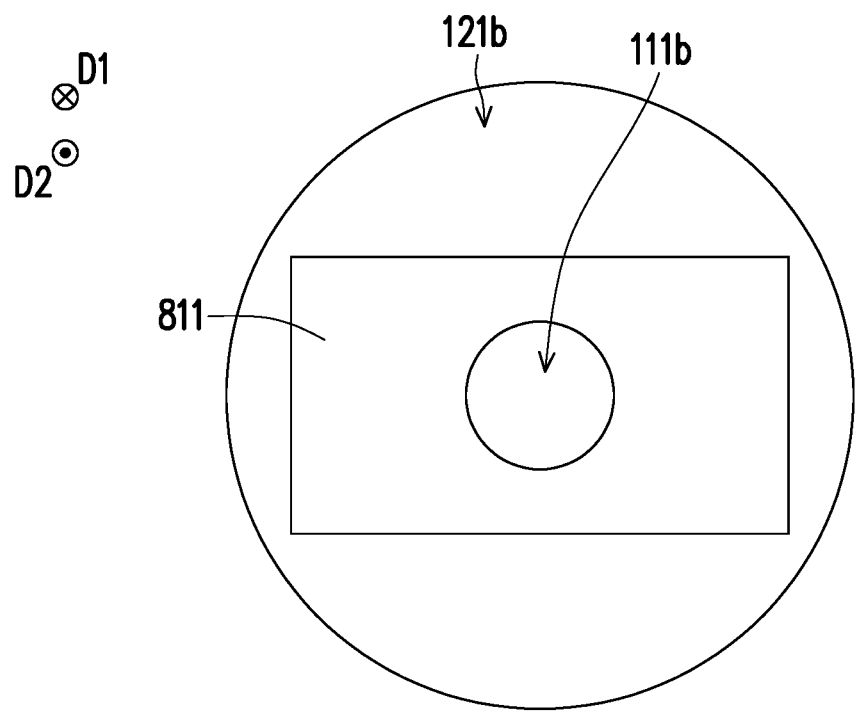
FIG. 1E is a schematic partial bottom view of the partial operation method of the apparatus for transferring the electronic component from the flexible carrier substrate to the flexible target substrate according to an embodiment of the invention.

Referring to FIG. 1E, when the electronic component 811 on the flexible carrier substrate 130 contacts the receiving point of the flexible target substrate 140, a contact area between the electronic component 811 and the flexible target substrate 140 may be made larger than a contact area between the electronic component 810 and the flexible carrier substrate based on the aforementioned method. In this way, transfer efficiency and/or a transfer yield of the electronic component 811 may be improved.

Referring to FIG. 1E, in an embodiment, when the electronic component 811 on the flexible carrier substrate 130 contact the receiving point of the flexible target substrate 140, a contact area between the pin bolt 121 of the deformation generating mechanism 120 and the flexible target substrate 140 may be larger than a contact area between the electronic component 811 and the flexible carrier substrate 130. In this way, shifting of the electronic component 811 on the flexible target substrate 140 during transfer may be reduced, and the transfer efficiency and/or the transfer yield of the electronic component 811 may be improved.

Referring to FIG. 1D and FIG. 1E, in an embodiment, when the electronic component 811 on the flexible carrier substrate 130 contacts the receiving point of the flexible target substrate 140, a contact area between the electronic component 810 and the flexible carrier substrate 130 may be substantially equal to a contact area between the abutment element 111 and the flexible carrier substrate 130. Moreover, through the above method, both of the flexible carrier substrate 130 and the flexible target substrate 140 may have corresponding deformations, so as to reduce a possibility that other electronic components 812 on the flexible carrier substrate 130 (for example, the electronic components 810 that have not been transferred) contact other electronic components 813 on the flexible target substrate 140 (for example, the electronic components 810 that have been transferred).

In an embodiment, after the electronic component 810 on the flexible carrier substrate 130 contacts the receiving point of the flexible target substrate 140, applying of the aforementioned action force (for example, to make the abutment element 111 to move in a direction away from the flexible carrier substrate 130) may be stopped, and/or applying of the aforementioned relative force (for example, to make the pin bolt 121 of the deformation generating mechanism 120 to move in a direction away from the flexible target substrate 140) may be stopped. Moreover, when or after the abutment element 111 moves in the direction away from the flexible carrier substrate 130 and/or when or after the pin bolt 121 moves in the direction away from the flexible target substrate 140, the flexible carrier substrate 130 and/or the flexible target substrate 140 may return to its original shape by its own elasticity/deflection, so that the flexible carrier substrate 130 may be completely separated from the electronic component 811.

Figure 2A:
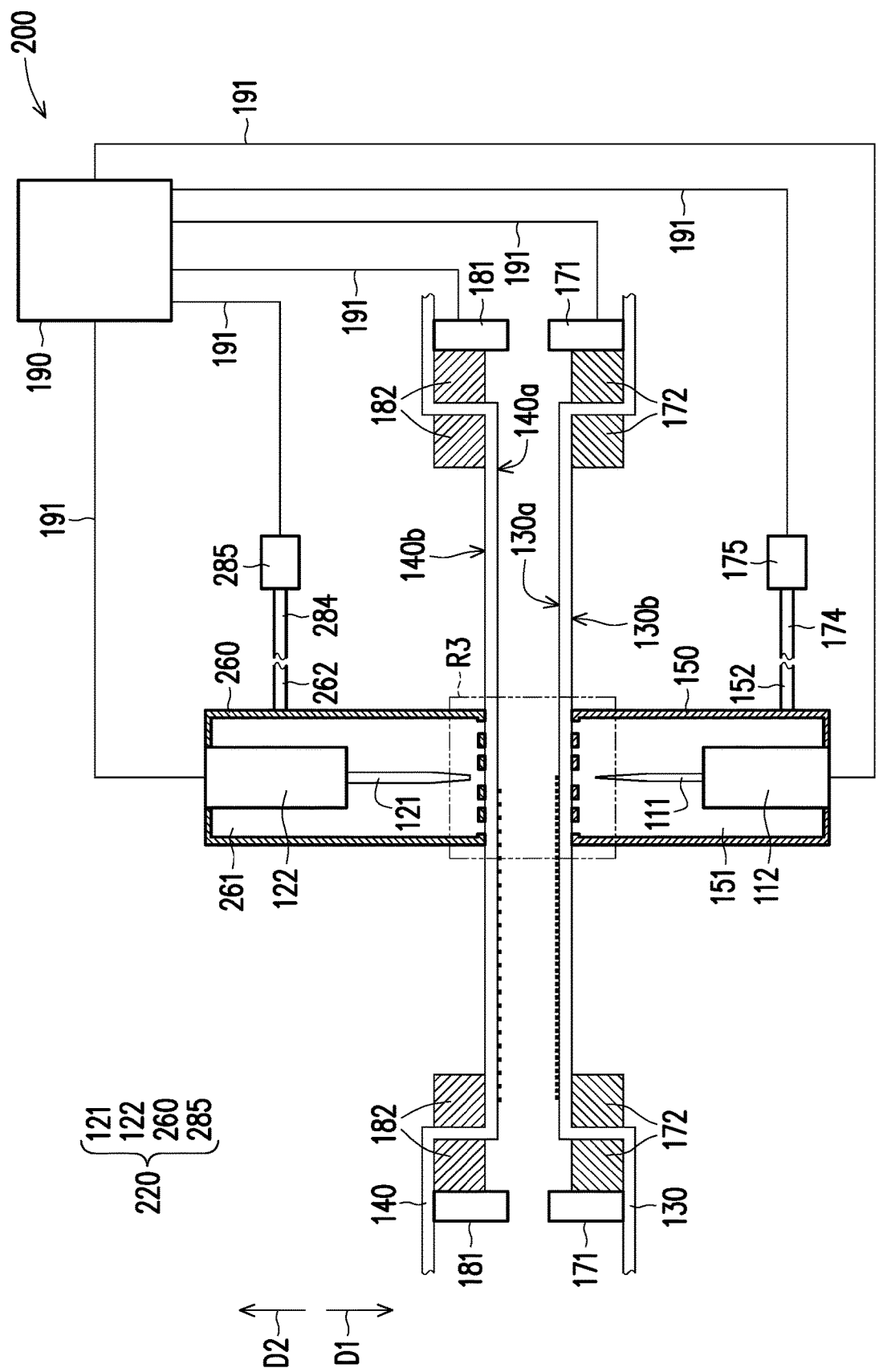
FIG. 2A is a schematic partial side view of an apparatus for transferring an electronic component from a flexible carrier substrate to a flexible target substrate according to a second embodiment of the invention.

Referring to FIG. 2A and FIG. 1A, an electronic component transfer apparatus 200 of the embodiment is similar to the electronic component transfer apparatus 100 of the first embodiment. Namely, the electronic component transfer apparatus 200 may include the first frame 171, the second frame 181, the abutment element 111, and a deformation generating mechanism 220.

The electronic component transfer apparatus 200 may be adapted to transfer the electronic components 810 from the flexible carrier substrate 130 to the flexible target substrate 140 in a manner similar to that described above, which may be described below. However, it should be noted that the invention is not limited to the method described later. In addition, for the sake of clarity, in the following partial drawings (for example, FIG. 2B to FIG. 2C), only the side cross-sectional views of some components corresponding to the region R3 in FIG. 2A are schematically shown. In addition, for the sake of clarity, some elements or components may be omitted in the subsequent partial drawings.

Figure 2B:
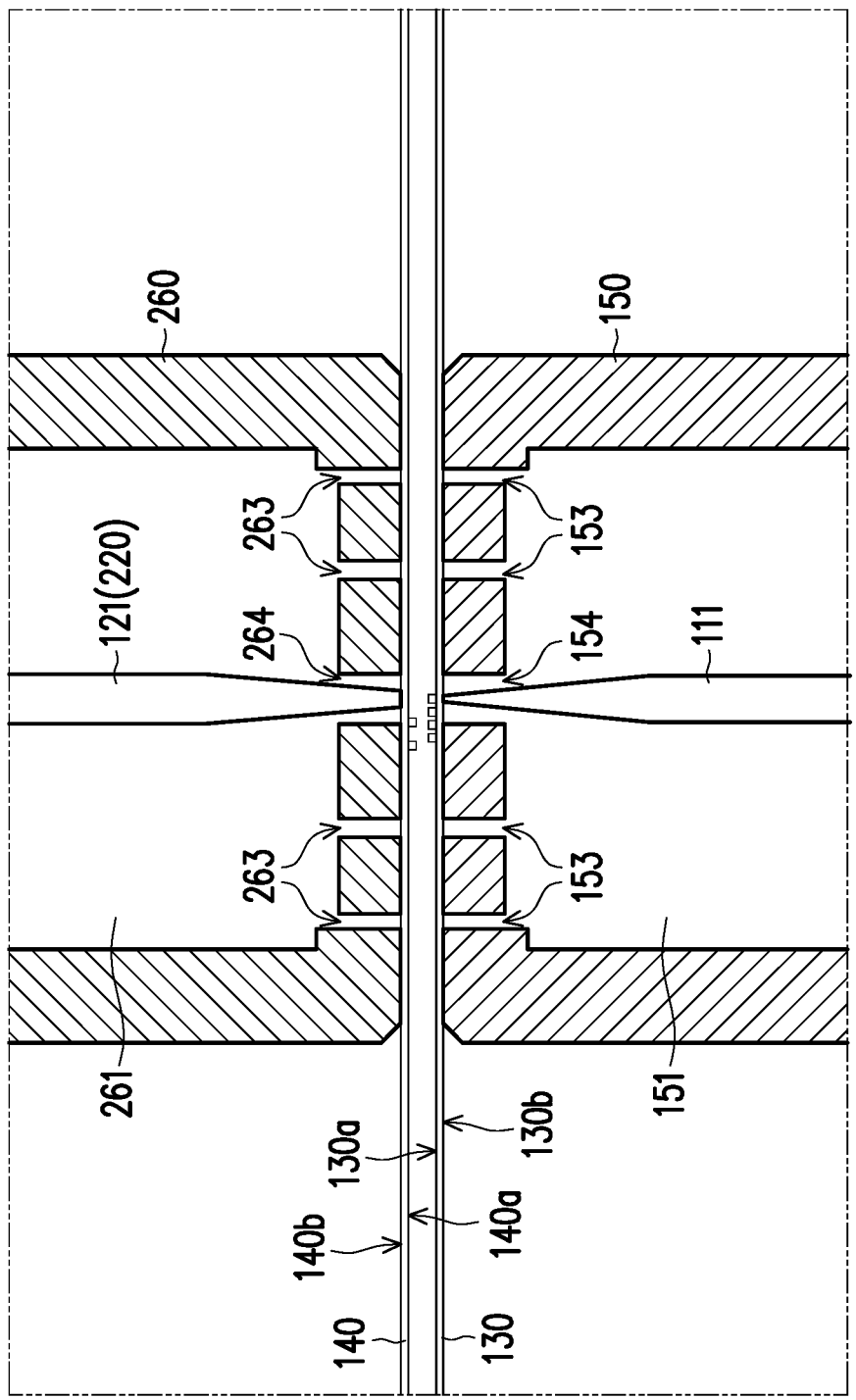
FIG. 2B to FIG. 2D are schematic partial side views of partial operation method of the apparatus for transferring the electronic component from the flexible carrier substrate to the flexible target substrate according to the second embodiment of the invention.

Referring to FIG. 2A and FIG. 2B, in the embodiment, the electronic component transfer apparatus 200 may further include a casing 260. The casing 260 may have a gas chamber 261, a gas channel 262 and at least one gas opening 263. The gas channel 262 and the gas opening 263 communicate with the gas chamber 261. A location of the gas opening 263 corresponds to the flexible target substrate 140.

Figure 2C:
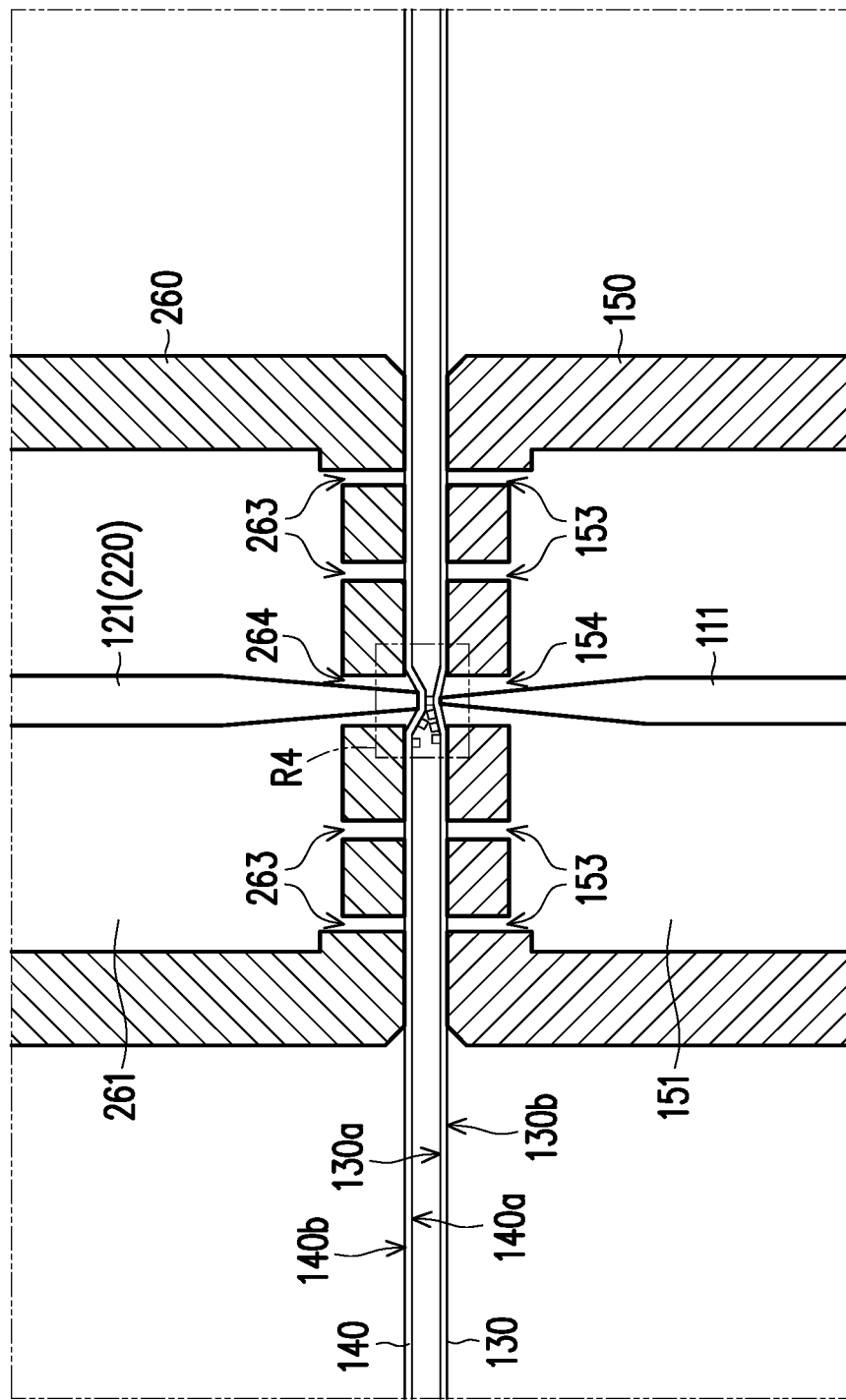
Figure 2D:
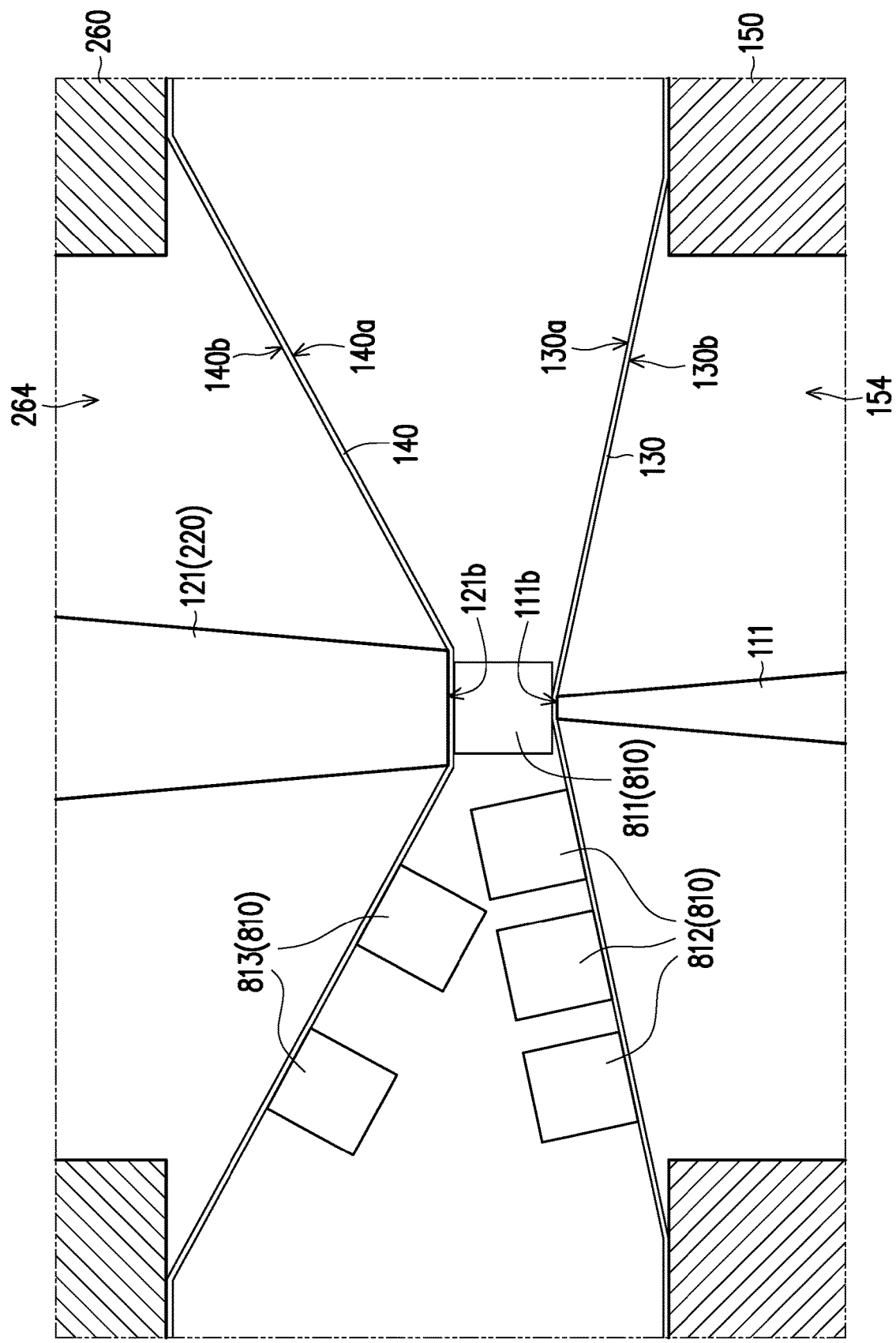

Referring to 2B and FIG. 2C or FIG. 2D, when the pin bolt 121 exerts a corresponding relative force on the flexible target substrate 140, a negative pressure generating device 285 may exhaust air through a gas pipeline 284 connected to the gas channel 262, so as to reduce a scope of deformation generated by the flexible target substrate 140. Namely, at least the pin bolt 121, the braking mechanism 122, the casing 260 and the negative pressure generating device 285 that are suitable for making the flexible target substrate 140 to generate corresponding deformation may be regarded as the deformation generating mechanism 220. In other words, the deformation generating mechanism 220 may include the pin bolt 121, the braking mechanism 122, the casing 260 and the negative pressure generating device 285.

Taking FIG. 2C and FIG. 2D as an example, the casing 260 may further have an abutment opening 264 communicating with the air chamber 261. The pin bolt 121 arranged in the casing 260 may abut against the flexible target substrate 140 through the abutment opening 264. When the pin bolt 121 of the deformation generating mechanism 220 exerts the corresponding relative force on the flexible target substrate 140, the negative pressure generating device 285 may exhaust air through the gas pipeline 284 communicated with the gas channel 262. In this way, a part of region of the flexible target substrate 140 corresponding to the abutment opening 264 may generate corresponding deformation due to the abutting of the pin bolt 121, so that the corresponding region abutted by the pin bolt 121 may move toward a direction of the flexible carrier substrate 130. In addition, an air pressure difference generated by the aforementioned air exhaustion (for example, an air pressure outside the casing 260 is greater than an air pressure in the air chamber 261 of the casing 260) may make the other regions of the flexible target substrate 140 corresponding to the gas openings 263 to be substantially not deformed. Therefore, transfer precision of the electronic component 811 may be improved.

In an embodiment, when the electronic component 811 on the flexible carrier substrate 130 contact the receiving point of the flexible target substrate 140, the air pressure in the air chamber 261 of the casing 260 is started to decrease.

In an embodiment, before the electronic component 811 on the flexible carrier substrate 130 contacts the receiving point of the flexible target substrate 140, the air pressure in the air chamber 261 of the casing 260 is started to decrease.

In an embodiment, before starting to decrease the air pressure in the air chamber 261 of the casing 260, the second target surface 140b of the flexible target substrate 140 may touch an outer surface of the casing 260, but the invention is not limited thereto. In an embodiment that is not shown, before starting to decrease the air pressure in the air chamber 261 of the casing 260, a gap may exist between the second target surface 140b of the flexible target substrate 140 and the outer surface of the casing 260.

Similar to the aforementioned manner, in an embodiment, after the electronic component 811 on the flexible carrier substrate 130 contacts the receiving point of the flexible target substrate 140, applying of the aforementioned action force may be stopped and/or applying of the aforementioned relative force may be stopped. Moreover, when or after the abutment element 111 moves in the direction away from the flexible carrier substrate 130 and/or when or after the pin bolt 121 of the deformation generating mechanism 220 moves in the direction away from the flexible target substrate 140, the flexible carrier substrate 130 and/or the flexible target substrate 140 may return to its original shape by its own elasticity/deflection, so that the flexible carrier substrate 130 may be completely separated from the electronic components 810.

Figure 3A:
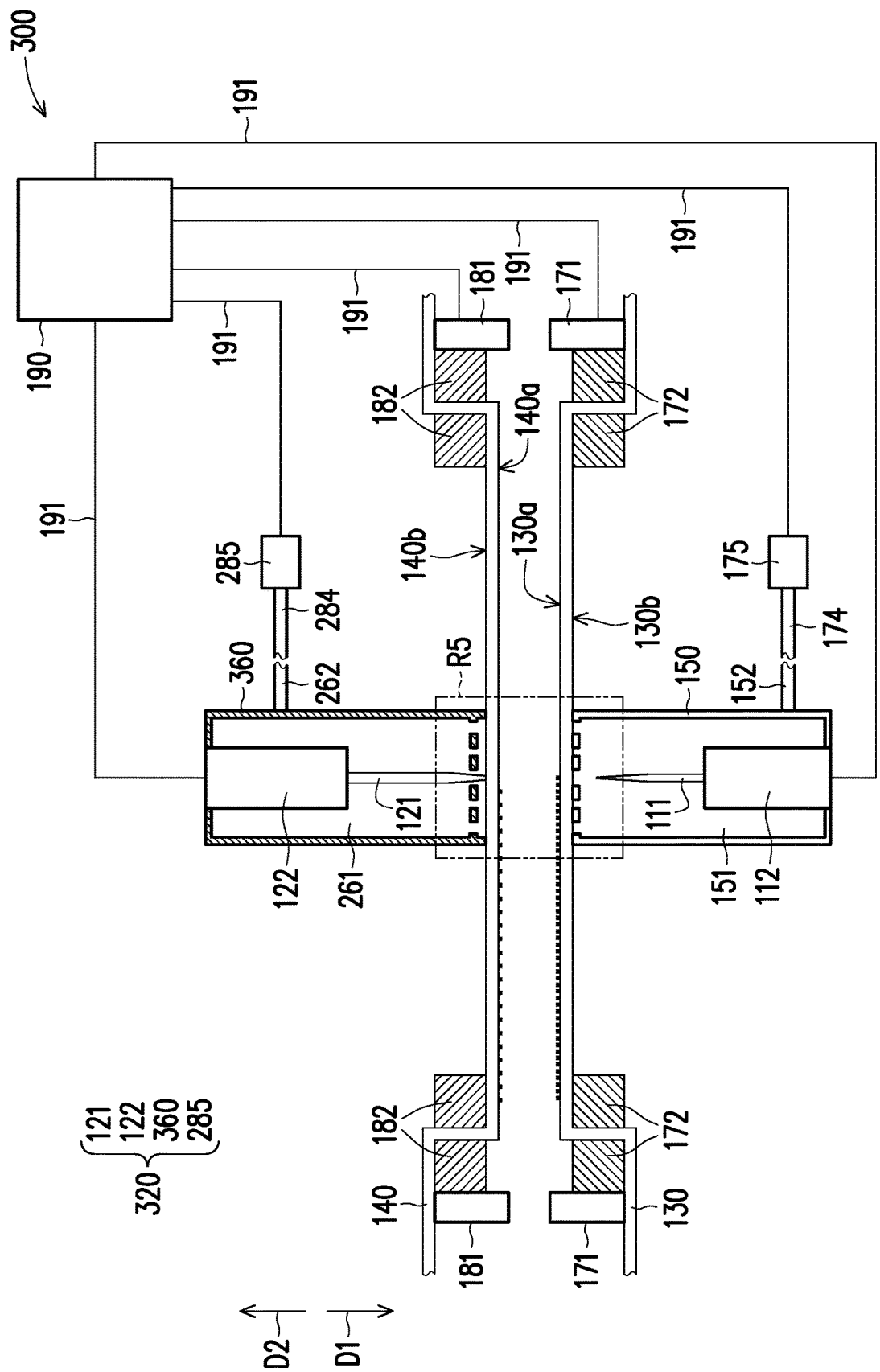
FIG. 3A is a schematic partial side view of an apparatus for transferring an electronic component from a flexible carrier substrate to a flexible target substrate according to a third embodiment of the invention.

Referring to FIG. 3A and FIG. 2A, an electronic component transfer apparatus 300 of the embodiment is similar to the electronic component transfer apparatus 200 of the second embodiment. Namely, the electronic component transfer apparatus 300 may include the first frame 171, the second frame 181, the abutment element 111, and a deformation generating mechanism 320.

The electronic component transfer apparatus 300 may be adapted to transfer the electronic components 810 from the flexible carrier substrate 130 to the flexible target substrate 140 in a manner similar to that described above, which may be described below. However, it should be noted that the invention is not limited to the method described later. In addition, for the sake of clarity, in the following partial drawings (for example, FIG. 3B to FIG. 3C), only the side cross-sectional views of some components corresponding to the region R5 in FIG. 3A are schematically shown. In addition, for the sake of clarity, some elements or components may be omitted in the subsequent partial drawings.

Figure 3B:
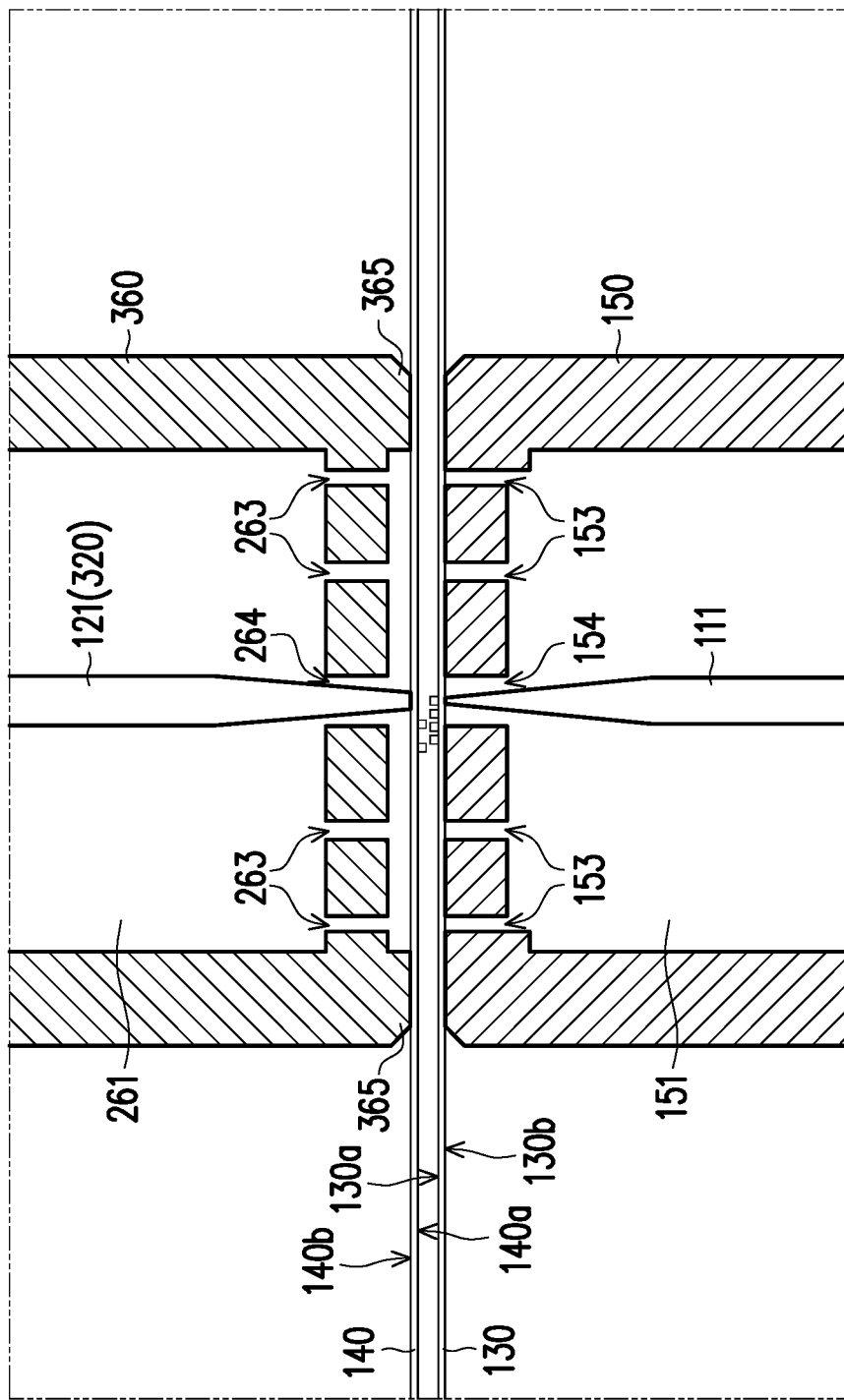

Referring to FIG. 3A and FIG. 3B, in the embodiment, the electronic component transfer apparatus 300 may further include a casing 360. The casing 360 may have a gas chamber 261, a gas channel 262, at least one gas opening 263 and a protrusion 365. The protrusion 365 may correspond to the flexible target substrate 140, and the protrusions 365 may be located at an edge of the casing 360.

Figure 3C:
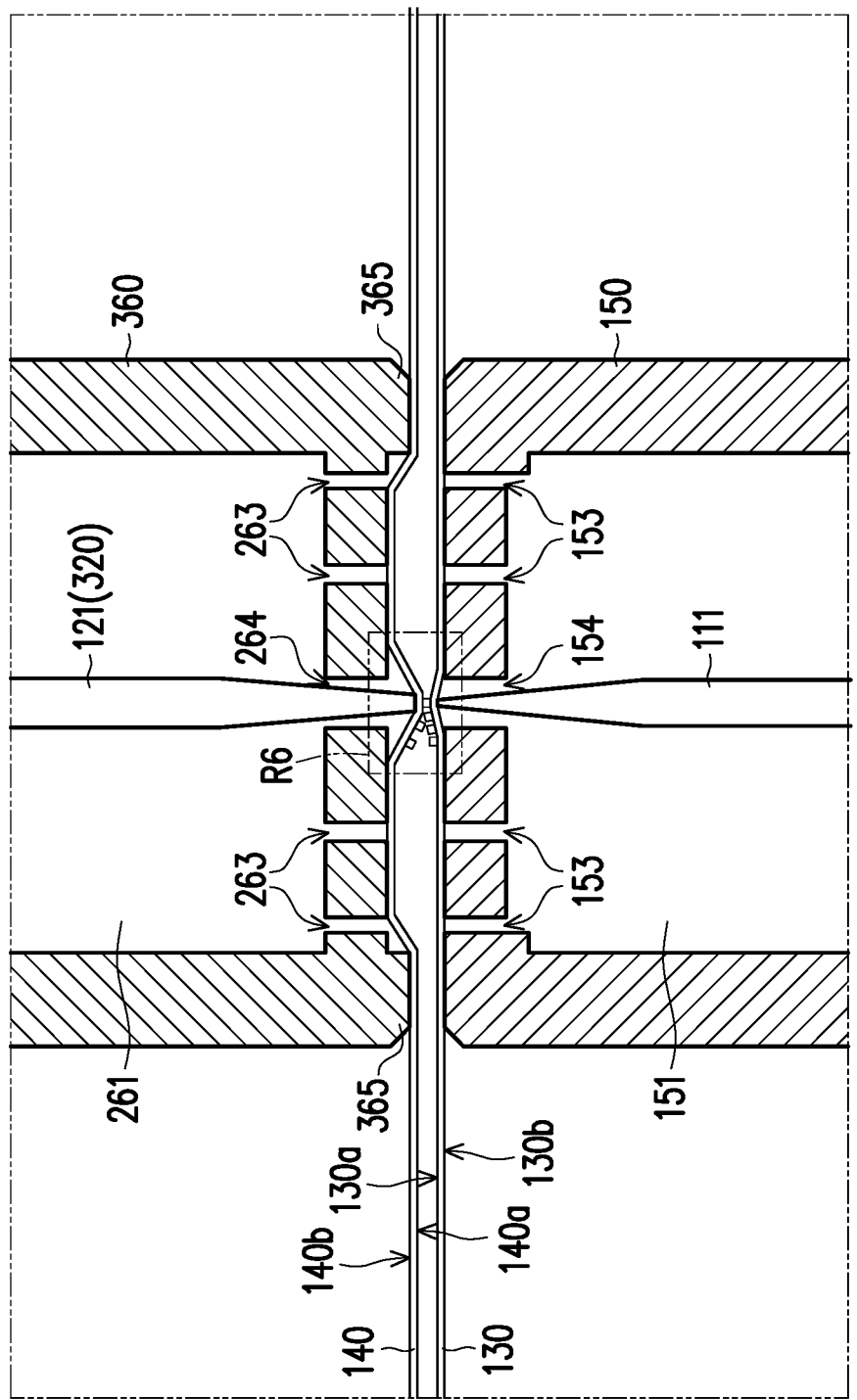

Referring to 3B and FIG. 3C or FIG. 3D, a relative force is applied to the flexible target substrate 140 to deform the flexible target substrate 140. Moreover, a receiving point may be defined on the deformed flexible target substrate 140, where the flexible target substrate 140 is far away from the electronic component 811 in a peripheral region of the receiving point. Namely, in the deformed flexible target substrate 140, the receiving point is closer to the electronic component 811 to be transferred than other regions (i.e., the peripheral region) different from the receiving point.

For example, the negative pressure generating device 285 may exhaust air. As a result, as shown in FIG. 3B to FIG. 3C, a partial region of the flexible target substrate 140 corresponding to the gas openings 263 may be relatively concave in the second direction D2 due to the air pressure difference. In addition, a partial region of the flexible carrier substrate 130 corresponding to the abutment opening 154 may be relatively convex in the first direction D1 due to the abutting of the abutment element 111. Namely, the relative force applied to the flexible target substrate 140 may be formed by exhausting air to the flexible target substrate 140 and abutting of the pin bolt 121. Namely, at least the pin bolt 121, the braking mechanism 122, the casing 360 and the negative pressure generating device 285 that are suitable for making the flexible target substrate 140 to generate corresponding deformation may be regarded as the deformation generating mechanism 320. In other words, the deformation generating mechanism 320 may include the pin bolt 121, the braking mechanism 122, the casing 360 and the negative pressure generating device 285. According to the aforementioned manner, the transfer accuracy of the electronic component 810 may be improved.

In an embodiment, before the electronic component 810 on the flexible carrier substrate 130 contacts the receiving point of the flexible target substrate 140, the air pressure in the air chamber 261 of the casing 360 is started to decrease.

In an embodiment, before starting to reduce the air pressure in the air chamber 261 of the casing 360, the second target surface 140b of the flexible target substrate 140 may touch an outer surface of the casing 360 (for example, at the protrusion 365 of the casing 360) or the target abutment surface 121b of the pin bolt 121, but the invention is not limited thereto. In an embodiment that is not shown, before the air pressure in the air chamber 261 of the casing 360 is started to decrease, there may be a gap between the second carrier surface 130b of the flexible carrier substrate 130 and the outer surface of the casing 360 (for example, at the protrusion 365 of the casing 360) and/or the target abutment surface 121b of the pin bolt 121.

Through suitable inversion, rotation, arrangement and/or combination, the components or elements in all of the figures may become components presented in another figure that is not shown. For example, in a figure or embodiment that is not shown, its aspect may be a rotation or up-down flip of FIG. 1A, FIG. 2A or FIG. 3A. For another example, in a figure or embodiment that is not shown, the casing corresponding to the abutment element 111 may be the same or similar to the casing corresponding to the pin bolt 121.

The method for transferring electronic component of the above embodiments may be applied to any suitable manufacturing process of electronic devices. For example, an electronic component 720 may comprise a light emitting diode chip, and the transfer method described above may be a part of a manufacturing process of a light emitting diode panel.

In summary, the electronic component transfer apparatus and the method for transferring electronic component of the invention may be adapted to transfer the electronic components on the flexible carrier substrate to the flexible target substrate.

What is claimed is:

1. A method of transferring an electronic component, comprising:
   providing a flexible carrier substrate, wherein the electronic component is carried on the flexible carrier substrate;
   providing a flexible target substrate;
   configuring the flexible carrier substrate and the flexible target substrate opposite to each other so that a surface of the flexible carrier substrate carrying the electronic component faces the flexible target substrate;
   applying an action force on a surface of the flexible carrier substrate that does not carry the electronic component so that the electronic component moves toward the flexible target substrate;
   applying a relative force on the flexible target substrate so that the flexible target substrate generates a deformation, defining a receiving point on the flexible target substrate by the deformation, and keeping a peripheral region of the receiving point on the flexible target substrate away from the electronic component;
   contacting and transferring the electronic component to the receiving point; and
   ceasing applying the action force and the relative force so that the flexible carrier substrate and the flexible target substrate return to their original shapes.

2. The method of transferring the electronic component as claimed in claim 1, wherein the action force is generated by a thimble abutting against the flexible carrier substrate.

3. The method of transferring the electronic component as claimed in claim 2, wherein the thimble does not penetrate the flexible carrier substrate during abutment.

4. The method of transferring the electronic component as claimed in claim 1, wherein the relative force is generated by a pin bolt abutting against the flexible target substrate.

5. The method of transferring the electronic component as claimed in claim 4, wherein the relative force is further formed by vacuuming the flexible target substrate and the abutting of the pin bolt.

6. The method of transferring the electronic component as claimed in claim 1, wherein the electronic component is an LED chip.

* * * * *